US009780117B2

(12) United States Patent
Nygaard et al.

(10) Patent No.: US 9,780,117 B2
(45) Date of Patent: Oct. 3, 2017

(54) SEMICONDUCTOR STRUCTURE WITH ACTIVE DEVICE AND DAMAGED REGION

(71) Applicant: QUALCOMM Incorporated, San Diego, CA (US)

(72) Inventors: Paul A. Nygaard, Carlsbad, CA (US); Michael A. Stuber, Rancho Santa Fe, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/521,327

(22) Filed: Oct. 22, 2014

(65) Prior Publication Data

US 2016/0118406 A1    Apr. 28, 2016

(51) Int. Cl.

| | | |
|---|---|---|
| *H01L 27/12* | (2006.01) | |
| *H01L 29/786* | (2006.01) | |
| *H01L 21/265* | (2006.01) | |
| *H01L 21/3205* | (2006.01) | |
| *H01L 21/84* | (2006.01) | |

(Continued)

(52) U.S. Cl.
CPC ........ *H01L 27/1203* (2013.01); *H01L 21/265* (2013.01); *H01L 21/32053* (2013.01); *H01L 21/84* (2013.01); *H01L 27/0629* (2013.01); *H01L 29/1095* (2013.01); *H01L 29/32* (2013.01); *H01L 29/47* (2013.01); *H01L 29/66143* (2013.01); *H01L 29/66477* (2013.01); *H01L 29/7839* (2013.01); *H01L 29/78612* (2013.01); *H01L 29/872* (2013.01)

(58) Field of Classification Search
CPC ............. H01L 27/1203; H01L 29/7839; H01L 29/66477; H01L 29/47; H01L 29/66143; H01L 21/32053; H01L 29/1095; H01L 29/32; H01L 21/265; H01L 21/84; H01L 29/872; H01L 27/0629; H01L 29/78612
USPC ......................................................... 257/350
See application file for complete search history.

(56) References Cited

U.S. PATENT DOCUMENTS

| | | |
|---|---|---|
| 5,804,858 A | 9/1998 | Hsu et al. |
| 5,821,575 A | 10/1998 | Mistry et al. |

(Continued)

FOREIGN PATENT DOCUMENTS

| | | |
|---|---|---|
| CN | 1308378 A | 8/2001 |
| JP | H07301825 | * 11/1995 |

(Continued)

OTHER PUBLICATIONS

Botula et al., A Thin-film SOI 180nm CMOS RF Switch Technology, Silicon Monolithic Integrated Circuits in RF Systems, Jan. 2009, IEEE Topical Meeting, p. 1-4.

(Continued)

*Primary Examiner* — Phat X Cao
*Assistant Examiner* — Mohammad M Hoque
(74) *Attorney, Agent, or Firm* — Haynes and Boone, LLP

(57) ABSTRACT

A semiconductor structure is formed with an active layer having an active device including a body region. The active device is formed by top side processing in and on a top side of a semiconductor on insulator wafer. A damaged region is formed within a portion of the body region by bottom side processing at a bottom side of the semiconductor on insulator wafer, the damaged region having a structure sufficient to prevent a kink effect and self-latching in operation of the active device.

7 Claims, 4 Drawing Sheets

(51) Int. Cl.
  *H01L 27/06* (2006.01)
  *H01L 29/10* (2006.01)
  *H01L 29/32* (2006.01)
  *H01L 29/47* (2006.01)
  *H01L 29/66* (2006.01)
  *H01L 29/78* (2006.01)
  *H01L 29/872* (2006.01)

(56) References Cited

U.S. PATENT DOCUMENTS

| | | | |
|---|---|---|---|
| 5,930,605 A * | 7/1999 | Mistry | H01L 21/84 257/E21.703 |
| 5,973,364 A * | 10/1999 | Kawanaka | 257/347 |
| 6,153,495 A * | 11/2000 | Kub et al. | 438/459 |
| 6,210,998 B1 * | 4/2001 | Son | 438/162 |
| 6,368,903 B1 * | 4/2002 | Bryant et al. | 438/151 |
| 6,509,613 B1 | 1/2003 | En et al. | |
| 6,541,822 B2 | 4/2003 | Bae et al. | |
| 7,927,934 B2 | 4/2011 | Min et al. | |
| 2002/0079544 A1 * | 6/2002 | Shino | 257/388 |
| 2002/0105032 A1 * | 8/2002 | Lee et al. | 257/349 |
| 2002/0140033 A1 * | 10/2002 | Bae et al. | 257/347 |
| 2003/0153136 A1 * | 8/2003 | Matsumoto et al. | 438/151 |
| 2003/0201494 A1 * | 10/2003 | Maeda et al. | 257/347 |
| 2005/0142794 A1 * | 6/2005 | Koh | 438/386 |
| 2005/0280088 A1 * | 12/2005 | Min | H01L 27/1203 257/347 |
| 2007/0241401 A1 | 10/2007 | Tsujiuchi | |
| 2008/0290413 A1 * | 11/2008 | Mandelman et al. | 257/347 |
| 2009/0302386 A1 | 12/2009 | Chou et al. | |
| 2009/0315138 A1 * | 12/2009 | Chang et al. | 257/506 |
| 2011/0193166 A1 | 8/2011 | Liang et al. | |
| 2014/0117409 A1 * | 5/2014 | Chou et al. | 257/192 |

FOREIGN PATENT DOCUMENTS

| | | |
|---|---|---|
| JP | H07301825 A | 11/1995 |
| JP | H07335887 A | 12/1995 |
| JP | H09283766 A | 10/1997 |
| JP | H1079511 A * | 3/1998 |
| JP | 2001230423 A * | 1/2000 |

OTHER PUBLICATIONS

Second Written Opinion from International Application No. PCT/US2015/056151, dated Oct. 12, 2016, 6 pages.

International Search Report—PCT/US2015/056151—ISA/EPO—dated Jan. 29, 2016.

Written Opinion—PCT/US2015/056151—ISA/EPO—dated Jan. 29, 2016.

Botula A., et al., "A Thin-film SOI 180nm CMOS RF Switch Technology," IEEE Topical Meeting on Silicon Monolithic Integrated Circuits in RF Systems, Jan. 2009, pp. 1-4.

* cited by examiner

SEMICONDUCTOR STRUCTURE WITH ACTIVE DEVICE AND DAMAGED REGION

BACKGROUND OF THE INVENTION

Semiconductor on insulator (SOI) devices can have carriers in the bulk due to the drain hot carrier effect. In floating body devices, these carriers can forward bias the source-body p-n junction and cause a "kink" effect and self-latching. Additionally, a parasitic bipolar transistor can thus be turned on.

The kink effect generally results in the appearance of a kink, or discontinuity, in the output characteristics of an SOI MOSFET operating in strong inversion. The kink effect can be very strong in n-channel transistors, but is usually absent from p-channel devices. In affected devices, when the drain voltage is high enough, the channel electrons can acquire sufficient energy in the high electric field zone near the drain to create electron-hole pairs, generally due to an impact ionization mechanism. The generated electrons move into the channel and the drain. On the other hand, the holes, which are majority carriers in the p-type body, migrate towards the place of lowest potential, i.e. the floating body. This injection of holes into the floating body can forward bias the source-body junction. It is necessary, therefore, to remove or recombine the carriers in order to prevent the ill effects thereof.

SUMMARY

Embodiments of the present invention involve a method in which an active device is formed by front side processing of a semiconductor on insulator wafer, and a damaged region is formed by back side processing of the semiconductor on insulator wafer. The active device includes a body region. The damaged region is formed within a portion of the body region. The damaged region prevents a kink effect and self-latching during operation of the active device.

Other embodiments of the present invention involve a semiconductor structure that includes an active layer and a damaged region. The active layer has an active device including a body region. The active device is formed by top side processing in and on a top side of a semiconductor on insulator wafer. The damaged region is formed within a portion of the body region by bottom side processing at a bottom side of the semiconductor on insulator wafer. The damaged region has a structure sufficient to prevent a kink effect and self-latching in operation of the active device.

In some embodiments, the body region, a gate region, a source region, and a drain region of the active device are formed by front side processing of the semiconductor on insulator wafer. In some embodiments, the damaged region is formed within the portion of the body region offset from the source region and the drain region. In some embodiments, the gate region is formed on a first portion of the body region and not on a second portion of the body region, the source region and the drain region are formed with part of the first portion of the body region between the source region and the drain region, and the damaged region is formed within the second portion of the body region. In some embodiments, a bandgap changing element is implanted into the portion of the body region into which the damaged region is formed. In some embodiments, a handle wafer is bonded to the semiconductor on insulator wafer, which is then inverted in order to allow for bottom or back side processing.

In some embodiments, a clamp region is formed that spans the channel region, extends into the source region and the drain region, and has a lower and opposite type dopant concentration than both the source region and the drain region. A pair of matching silicide regions are formed on opposite sides of the body region and in contact with the clamp region. The clamp region forms a pair of Schottky diode barriers with the pair of matching silicide regions. The pair of Schottky diode barriers provide a constant sink for accumulated charge in the body region.

A more complete appreciation of the present disclosure and its scope, and the manner in which it achieves the above noted improvements, can be obtained by reference to the following detailed description of presently preferred embodiments taken in connection with the accompanying drawings, which are briefly summarized below, and the appended claims.

DETAILED DESCRIPTION OF THE INVENTION

The kink effect can be reduced or eliminated by making an electrical contact with the body to apply a voltage to a portion of the body. This voltage can cause the holes to drift to the electrical contact at which point the holes can be removed or recombined. The electrical contact, however, takes up valuable physical space in the overall integrated circuit and requires electrical power to function.

Alternatively, a damaged region may be formed in the body in order to reduce the lifetime of carriers that come in contact with the damaged region. The low carrier lifetime enhances the likelihood of carrier recombination. Formation of the damaged region, however, has heretofore presented various problems. For example, the damaged region generally has to be disposed underneath various other components of the active device and overall integrated circuit. If the damaged region is formed early in the fabrication process, however, subsequent processing steps may reduce the damage, e.g., a high temperature anneal could cause the crystals to reform in the damaged area. On the other hand, if the damaged region is formed late in the fabrication process, then a damaging implant may have to be performed through other structures or components of the active layer, potentially damaging the other structures or components. Alternatively, a space between the other structures or components may have to be reserved for forming a hole down to the region to be damaged, thereby increasing the size of the overall integrated circuit.

Figure 1:
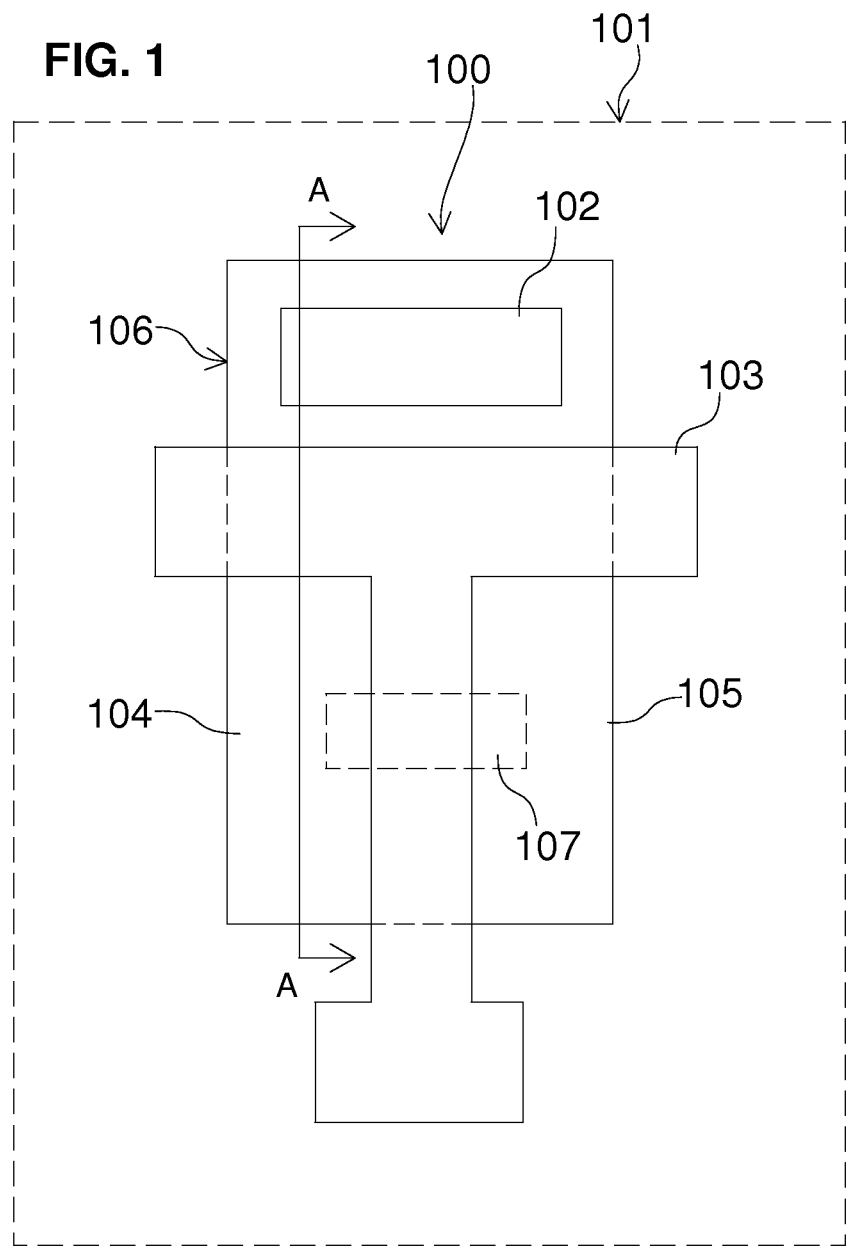
FIG. 1 is a simplified plan view of a semiconductor structure incorporating an embodiment of the present invention.

A semiconductor structure 100 of an example active device within an active layer of an overall integrated circuit 101 has a damaged region 102 for preventing the kink effect, self-latching or a parasitic bipolar transistor in accordance with embodiments of the present invention, as shown in FIG. 1. Since the semiconductor structure 100 incorporates the damaged region 102, a contact to the body or bulk of the semiconductor structures 100 for applying a voltage to the body is not needed for mitigating the kink effect, self-latching or parasitic bipolar transistor. Additionally, in accordance with embodiments of the present invention, whereas the other components (described below) of the semiconductor structure 100 are primarily formed by top or front side processing of a semiconductor on insulator wafer for the overall integrated circuit 101, the damaged region 102 is generally formed by bottom or back side processing. In this manner, the damaged region 102 can be formed late in the overall fabrication process, so that there are no (or relatively few) subsequent processing steps that could reduce the damage in, and commensurate efficacy of, the damaged region 102, so that the use of bottom or back side processing provides more desirable results for the structure of the damaged region 102 than is possible with front or top side processing. Additionally, it is not necessary to implant a damaging species through any of the other components of the semiconductor structure 100, nor is it necessary to reserve a space for a hole down to the damaged region 102 as with top side damage implantation. The net result is that the damage to the damaged region 102 is well-formed without affecting any of the other components or the formation thereof.

The semiconductor structure 100 is shown and described herein as a field effect transistor (a FET). Thus, in addition to the damaged region 102, the semiconductor structure 100 generally includes a gate region 103, a source region 104, a drain region 105, and a body region 106 surrounded by insulator material. In this example, the gate region 103 is shown generally having a T-shape primarily overlaying a portion of the body region 106. The source region 104 and the drain region 105 are on opposite sides of a central, narrow, elongated portion of the T-shape of the gate region 103. A channel region is formed in the body region 106 under the gate region 103 primarily under the central, narrow, elongated portion of the T-shape, but also under the upper, wider portion of the T-shape.

Any element that is not a donor or acceptor can be used to create the damage. For example, argon, germanium, or silicon can be used. Implant dose and energy are selected to reduce carrier lifetime sufficiently to eliminate the kink effect.

The damaged region 102 is offset from the gate region 103, the source region 104, and the drain region 105 away from the device channel region and P-N junctions between the source/drain region 104/105 and the body region 106 to prevent junction leakage. However, the damaged region 102 is generally disposed as close to the upper, wider portion of the T-shape of the gate region 103 as is practical or reasonable in order to capture as many of the carriers generated within the body region 106 as possible. In operation, therefore, the damaged region 102 mitigates or eliminates the undesirable kink effect, self-latching or parasitic bipolar transistor in the performance of the semiconductor structure 100. Additionally, the size of the damaged region 102 may be adjusted to change the total device damage.

Even without applying a voltage to the damaged region 102, it is possible to make the damaged region 102 more attractive to the charge to be collected, i.e., the holes, by changing the semiconductor workfunction of the damaged region 102 accordingly. In other words, the bandgap of the damaged region 102 is decreased. To do this, a bandgap changing element may be implanted into the damaged region 102 at some point prior to the damaging implant, e.g., by either top side processing (before top side bonding of a handle wafer, as described below) or bottom side processing. Alternatively, the region that is to become the damaged region 102 may be formed by an epitaxy that includes the bandgap changing element. During operation, the decreased bandgap of the damaged region 102 will tend to pull holes out of the P-type body region 106. When the holes are pulled into the damaged region 102, a relatively short carrier lifetime will enable the holes to recombine relatively quickly with electrons. The source of the electrons may be an N-type doped region adjacent to the P-type body region 106, for example on the edge of the body region 106 on the side opposite the gate region 103. Another source of electrons can be from thermally-generated electron-hole (e-h) pairs in the damaged region 102.

An advantage of some embodiments of the present invention is that the damaged region 102 may be formed after the formation of a thin metal (e.g., cobalt, etc.) silicide layer on the source region 104 and the drain region 105 for low sheet resistance and low contact resistance in the active areas. Thus, high temperature process steps associated with forming the silicide layer cannot adversely affect the damaged region 102, e.g., by annealing out the damage. (The silicide layer should not be formed over the area that will later become the damaged region 102, but should be blocked out of this area, e.g., with an SAB mask.)

In some embodiments, the semiconductor structure 100 has at least one strip of non-source/drain implant, such as a clamp region 107, e.g., for a Schottky switch style transistor. The clamp region 107 and its function in the semiconductor structure 100 may be similar to that described in commonly owned, copending U.S. patent application Ser. No. 14/491,783, filed Sep. 19, 2014, and titled "Schottky Clamped Radio Frequency Switch." The contents and disclosure of U.S. patent application Ser. No. 14/491,783 is incorporated as if fully set forth herein. In particular, the clamp region 107 is disposed in the gate region 103, spans the channel region and extends into the source region 104 and the drain region 105. The clamp region 107 may have a lower and opposite type dopant concentration than the source region 104 and the drain region 105. Silicide in the clamp region 107 generally forms Schottky barrier diodes to the body region 106. Such silicides generally form Schottky diode barriers when constructed on a semiconductor material, such as silicon, when the semiconductor material is lightly doped. The damaged region 102, in combination with this pair of Schottky diode barriers layout, may provide regions of damage and increased bandgap, as well as a constant sink for accumulated charge in the body region 106, at regularly-spaced locations along the width of the semiconductor structure 100.

Figure 2:
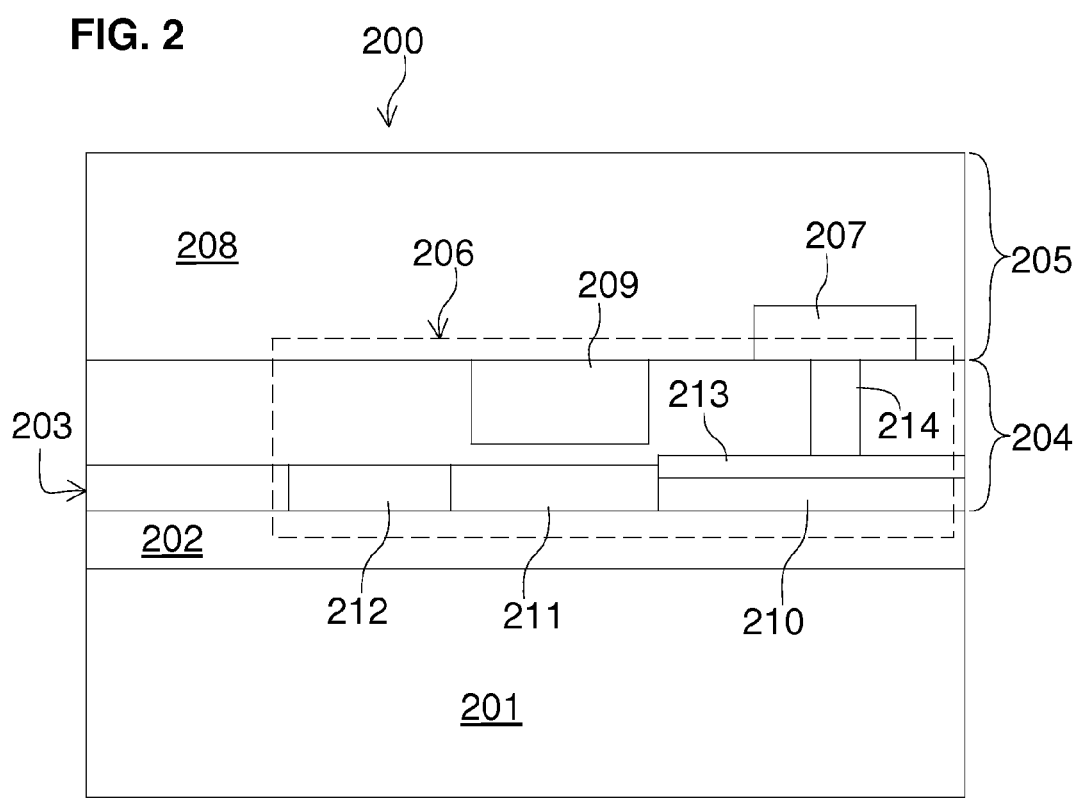
FIGS. 2 and 3 are simplified cross-section views of semiconductor structures at different stages in the fabrication of the semiconductor structure shown in FIG. 1 in accordance with embodiments of the present invention.

A cross section of a simplified example of a semiconductor structure 200 along section line A-A (FIG. 1) at an intermediate stage in the fabrication of the semiconductor structure 100 is shown in FIG. 2. The semiconductor structure 200 is shown and described as being part of, and formed in and on, an SOI wafer having a substrate layer 201, a buried insulator layer 202, and a semiconductor material layer 203. However, the present invention is also applicable to other types of semiconductor wafers in which an active layer can be formed. In this example, the semiconductor structure 200 also has an active layer 204 and an interconnect layer 205. The active layer 204 includes a variety of active devices (e.g., 206) generally formed in and on the semiconductor material layer 203. The interconnect layer 205 includes layers of conductive traces (e.g., 207) surrounded by insulator material 208.

The active device 206 generally includes a polysilicon gate region 209, a source region 210 (a drain region is not in the plane of this cross section), and a body region 211 similar to the gate region 103, the source region 104, and the body region 106, respectively, of FIG. 1. Additionally, a region 212 that will become a damaged region (similar to 102 above) is part of the body region 211 offset from the gate region 209 and the source (and drain) region 210. At this intermediate fabrication stage, the region 212 may have received the bandgap changing element implant discussed above. A metal silicide layer 213 (as described above) and a conductive via 214 contact to the conductive trace 207 are also shown. Each of the components described at this stage (e.g., 204-214) have generally been formed by top or front side processing steps performed on the SOI wafer (e.g., 201-203).

Figure 3:
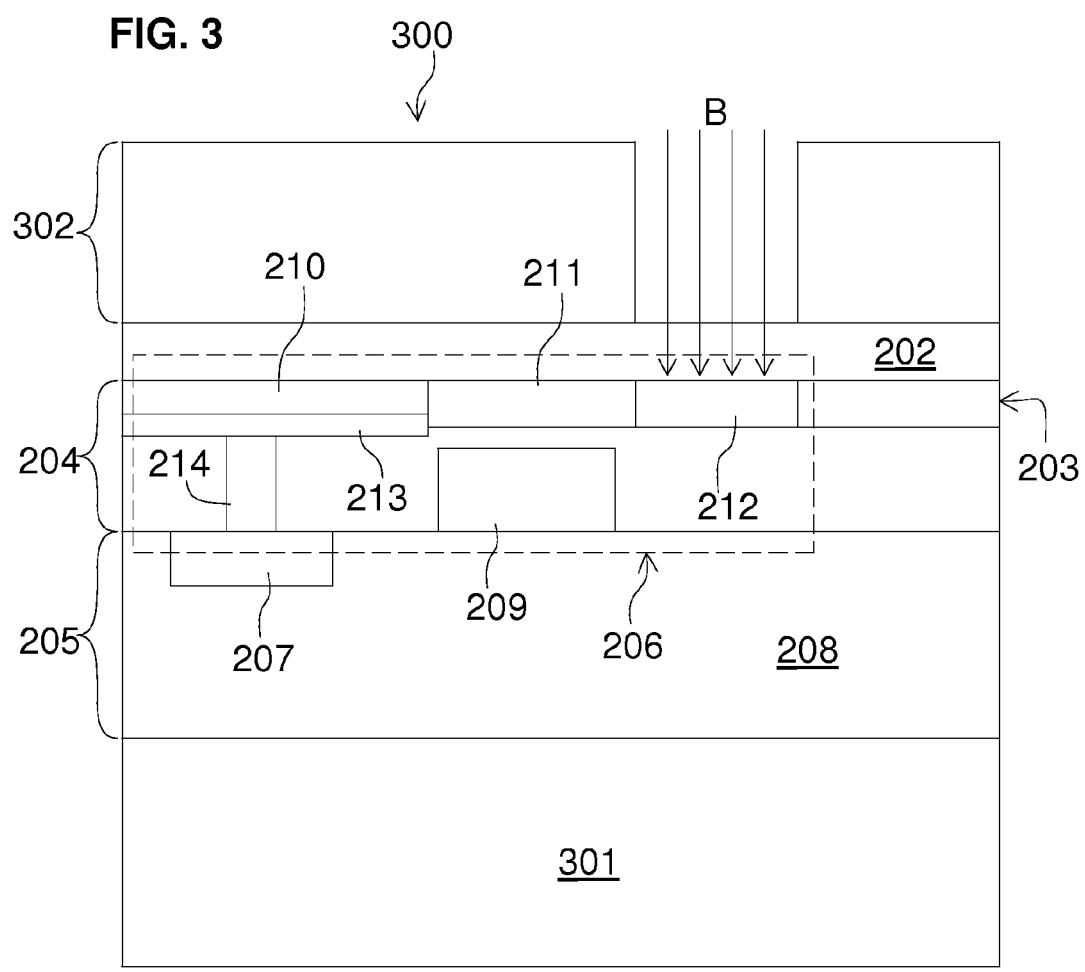

A cross section of a simplified example of a semiconductor structure 300 along section line A-A (FIG. 1) at a later intermediate stage in the fabrication of the semiconductor structure 100 is shown in FIG. 3. At this stage, a handle wafer 301 has been bonded to the top of the interconnect layer 205, or to an intervening insulator, passivation or bonding layer. Additionally, the semiconductor structure 300 has been inverted from the orientation shown in FIG. 2, so that the "top" and "bottom" of the semiconductor structure 300 are now at the bottom and top, respectively. Despite this inversion, the parts previously referred to as the "top" and "bottom" will continue to be referred to as such herein.

The handle wafer 301 provides structural stability so that, after the inversion, the underlying substrate layer 201 and optionally at least part of the buried insulator layer 202 can be removed from the bottom of the semiconductor structure 300. The intermediate stage of FIG. 3 shows the semiconductor structure 300 after the removal of the substrate layer 201 and the addition and patterning of a mask layer 302. The mask layer 302 is patterned to form a hole exposing the bottom surface (inverted) of the semiconductor structure 300 in the area of the region 212. A damaging implant (arrows B) is then performed by bottom or back side processing into the region 212 to form the damaged region 102 (FIG. 1), as described above. The mask layer 302 is then removed and further processing may be conducted to finish the overall integrated circuit.

Figure 4:
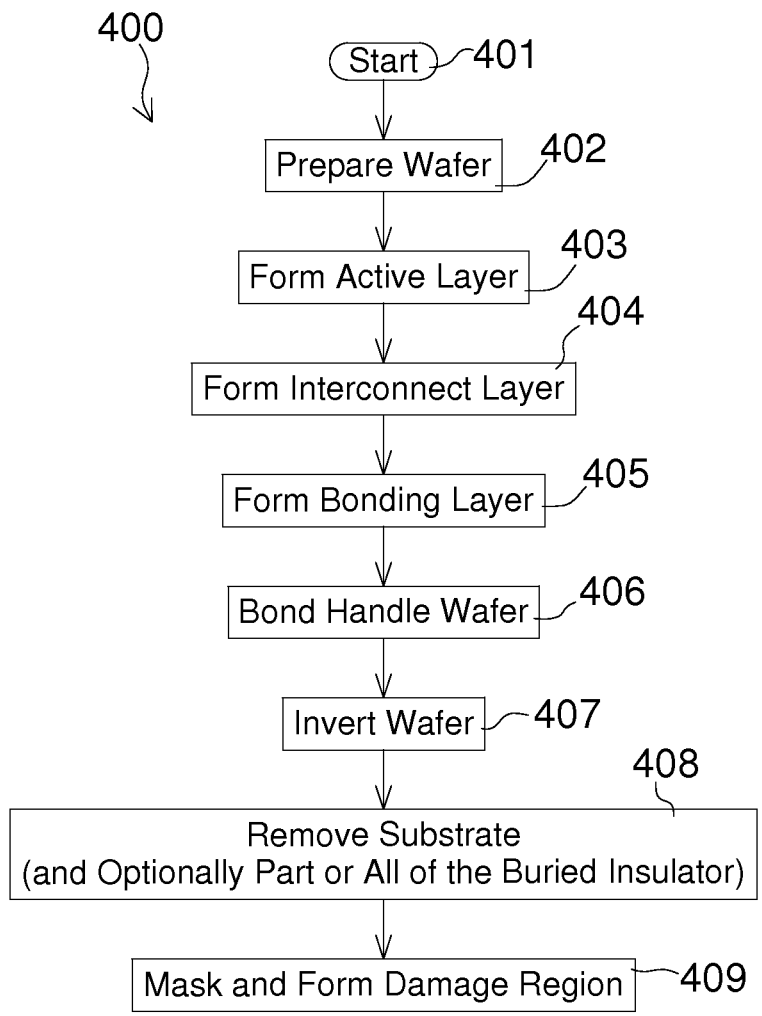
FIG. 4 is a flowchart for a simplified process for fabricating the semiconductor structure shown in FIG. 1 in accordance with embodiments of the present invention.

A flowchart for a simplified process for performing the above described steps to form the semiconductor structure 100 (including intermediate stage semiconductor structures 200 and 300) is shown in FIG. 4. Upon starting (at 401), a wafer (e.g., an 501 wafer) is prepared (at 402) for processing. At 403, the active layer 204 is formed by top or front side CMOS processing to form the active device 206 described above, including the body region 106/211, the gate region 103/209, the source region 104/210, and the drain region 105, and optionally with the bandgap changing element implant in the region 212 and/or the clamp region 107. At 404, the interconnect layer 205 is formed. At 405, a bonding layer (if needed) is formed on the top of the semiconductor structure 200. At 406, the handle wafer 301 is bonded to the top of the semiconductor structure 200. At 407, the bonded wafer structure 200/301 is inverted. At 408, the substrate 201 (and optionally part or all of the buried insulator layer 202) is removed, e.g., by grinding or etching. At 409, the mask layer 302 is formed and patterned, so that the damaging implant can be performed on the region 212 by bottom or back side processing to form the damaged region 102. Further processing (not shown) may then be performed to finish the overall integrated circuit 101.

Although embodiments of the present invention have been discussed primarily with respect to specific embodiments thereof, other variations are possible. Various configurations of the described system may be used in place of, or in addition to, the configurations presented herein. For example, additional components may be included where appropriate. As another example, configurations were described with general reference to certain types and combinations of semiconductor components, but other types and/or combinations of semiconductor components could be used in addition to or in the place of those described.

Those skilled in the art will appreciate that the foregoing description is by way of example only, and is not intended to limit the present invention. Nothing in the disclosure should indicate that the present invention is limited to systems that have the specific type of semiconductor components shown and described, unless otherwise indicated in the claims. Nothing in the disclosure should indicate that the present invention is limited to systems that require a particular form of semiconductor processing or integrated circuits, unless otherwise indicated in the claims. In general, any diagrams presented are only intended to indicate one possible configuration, and many variations are possible. Those skilled in the art will also appreciate that methods and systems consistent with the present invention are suitable for use in a wide range of applications.

While the specification has been described in detail with respect to specific embodiments of the present invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

What is claimed is:

1. A semiconductor structure comprising:
    an active layer with an active device including a body region having a first portion, a second portion, a source region, and a drain region, with a gate region formed over the first portion of the body region, the active device formed by top side processing in and on a top side of a semiconductor on insulator wafer; and
    a damaged region formed within the second portion of the body region offset from the source region, the drain region, and the first portion by bottom side processing at a bottom side of the semiconductor on insulator wafer subsequent to the top side processing, the damaged region including a bandgap changing element that was provided prior to formation of the damaged region, the damaged region having a structure sufficient to prevent a kink effect and self-latching in operation of the active device, damage to the damaged region being caused by implantation of an element that is not a donor or acceptor into the second portion, wherein the damage to the damaged region is not diminished subsequent to the implantation and the implantation of the damage region does not result in the element being implanted into other portions of the active layer.

2. The semiconductor structure of claim 1, wherein: the damaged region includes ions implanted into the bottom side of the semiconductor on insulator wafer to cause damage to the bottom side of the semiconductor on insulator wafer.

3. The semiconductor structure of claim 1, wherein: the damaged region is outside of a channel region of the active device.

4. The semiconductor structure of claim 1, wherein:
the damaged region is outside of a P-N junction region of the active device.

5. The semiconductor structure of claim 1, wherein:
a substrate layer and at least part of a buried insulator layer are removed from the semiconductor on insulator wafer before the damaged region is formed.

6. The semiconductor structure of claim 1, further comprising: a handle wafer bonded to the top side of the semiconductor on insulator wafer.

7. The semiconductor structure of claim 1, further comprising: a clamp region that spans the channel region, extends into a source region and a drain region of the active device, and has a lower and opposite type dopant concentration than both the source region and the drain region; and
a pair of matching silicide regions on opposite sides of the body region and in contact with the clamp region;
wherein the clamp region forms a pair of Schottky diode barriers with the pair of matching silicide regions; and
wherein the pair of Schottky diode barriers provide a constant sink for accumulated charge in the body region.

* * * * *